(12) United States Patent
Kitagawa et al.

(10) Patent No.: US 6,392,463 B1
(45) Date of Patent: May 21, 2002

(54) ELECTRICAL LOAD DRIVING CIRCUIT WITH PROTECTION

(75) Inventors: Masahiro Kitagawa; Junichi Nagata, both of Aichi-ken (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/658,576

(22) Filed: Sep. 8, 2000

(30) Foreign Application Priority Data

Jul. 7, 2000 (JP) ........................................ 2000-206609

(51) Int. Cl.$^7$ ............................................... H03K 5/08
(52) U.S. Cl. .......................... 327/309; 327/313; 327/108
(58) Field of Search ................................. 327/309, 310, 327/108, 109, 110, 111, 421, 422, 424, 427, 434, 502, 503, 312, 314, 313; 361/56, 91, 92; 257/140, 146, 133

(56) References Cited

U.S. PATENT DOCUMENTS

| | | | | |
|---|---|---|---|---|
| 3,979,607 A | * | 9/1976 | Beelitz et al. | 327/310 |
| 5,023,692 A | * | 6/1991 | Wodarczyk et al. | 357/43 |
| 5,028,811 A | * | 7/1991 | Le Roux et al. | 327/110 |
| 5,079,608 A | * | 1/1992 | Wodarczyk et al. | 357/23.13 |
| 5,115,369 A | | 5/1992 | Robb et al. | 361/93 |
| 5,162,966 A | * | 11/1992 | Fujihira | 257/140 |
| 5,264,736 A | * | 11/1993 | Jacobson | 327/365 |
| 5,401,996 A | | 3/1995 | Kelly | 257/360 |
| 5,764,088 A | | 6/1998 | Lavieville et al. | 327/110 |
| 5,812,006 A | * | 9/1998 | Teggatz et al. | 327/309 |
| 5,828,244 A | * | 10/1998 | Palara et al. | 327/108 |
| 5,875,089 A | * | 2/1999 | Higashide et al. | 361/111 |
| 5,963,066 A | * | 10/1999 | Fukunaga | 327/112 |
| 6,127,746 A | * | 10/2000 | Clemente | 307/131 |
| 6,201,427 B1 | * | 3/2001 | Osborn et al. | 327/310 |
| 6,204,715 B1 | * | 3/2001 | Sellnau et al. | 327/309 |

FOREIGN PATENT DOCUMENTS

| | | |
|---|---|---|
| JP | 59-181722 | 10/1984 |
| JP | 63-37712 | 2/1988 |
| JP | 4-135938 | 5/1992 |
| JP | 6-326579 | 11/1994 |
| JP | 8-64812 | 3/1996 |
| JP | 8-279736 | 10/1996 |

\* cited by examiner

Primary Examiner—Terry D. Cunningham
Assistant Examiner—Hai L. Nguyen
(74) Attorney, Agent, or Firm—Law Offices of David G. Posz

(57) ABSTRACT

In the high side switch type of electrical load driving circuit, wherein an N channel MOS transistor is provided on the circuit for supplying power to the electrical load, a zener diode is provided between the drain and the source of the MOS transistor to protect the MOS transistor. A load is provided between the gate and the ground to protect the MOS transistor. In this circuit, when a positive high voltage is induced on the side of the electrical load, the zener and a parasitic diode of the MOS transistor flows forward currents which absorb the high voltage noise. When a negative high voltage noise is induced from the side of the electrical load, a breakdown current flows through the zener diode, so that the voltage difference between the drain and source is clamed to a predetermined voltage. Then, the diode turns on the MOS transistor. Thus, the MOS transistor can be surely protected from high voltage noises without increasing the current capacities of elements for the protection circuit.

10 Claims, 6 Drawing Sheets

ELECTRICAL LOAD DRIVING CIRCUIT WITH PROTECTION

BACKGROUND OF THE INVENTION

1. Field of the Invention

This invention relates to an electrical load driving circuit with protection.

2. Description of the Prior Art

An electrical load driving circuit including a MOS transistor for turning on and off the electrical passage supplying a driving power to an electrical load is known. Moreover, an electrical load driving circuit having a protection 12 is a schematic circuit diagram of such a prior art electrical load driving circuit including such a protection circuit. This electrical load driving circuit 90 includes an N channel MOS transistor Tr0 as a high side switch on the passage from a positive electrode of a dc power supply 2 to an electrical load 4. The MOS transistor Tr0 is turned on and off in accordance with a control signal supplied to the gate of the MOS transistor Tr0 to drive the electrical load 4

The drain of the MOS transistor Tr0 is connected to the positive terminal of the dc power supply 2 through a connection terminal TB and the source of the MOS transistor Tr0 is connected to one terminal of the electrical load 4 through a connection terminal TL. Moreover, between the gate and the source of the MOS transistor Tr0, a resistor R0 for reducing the impedance between the gate and the source to stabilize the turning-on and turning-off operations of the MOS transistor Tr0 is provided.

In the electrical load driving circuit 90, the MOS transistor Tr0 turns on when a gate potential of the MOS transistor Tr0 is higher than a source potential by a voltage MOS transistor Tr0 is supplied with a positive voltage through a switch SW (for example, a transistor) which is controlled in accordance with a switch control signal.

In this electrical load driving circuit 90, a high voltage terminal TL to the electrical load 4 or the terminal Ta connected to the electrical load 4 due to electrostatic charges developed at the human body or at the other equipment. If such a high voltage noise is applied to the MOS transistor Tr0, the drain-source voltage of the MOS transistor may be higher than the withstanding voltage, so that the MOS transistor Tr0 may be destroyed or the characteristic of the MOS transistor may be deteriorated. Japanese Patent application provisional publication NO. 59-181722 discloses a protection circuit for a prior art electrical load driving circuit.

This protection circuit is applied to the electrical load driving circuit 90. The protection circuit comprises a diode Da, the cathode being connected to the line to which the high voltage noise is applied, the anode being connected to the ground and an NPN transistor Tra of which collector is connected to the line, and a resistor Ra of which both ends are connected to the base and the emitter of the NPN transistor Tra.

In this protection circuit, if a positive electrostatic charge which is higher than the ground potential is applied to the terminal Ta, the voltage difference between the collector and the base of the NPN transistor Tra may exceed the collector-base breakdown voltage. Then, breakdown between the collector and the base occurs. This current acts as the base current of the NPN transistor Tra, so that the NPN electrostatic charge developed at the terminal Ta follows the NPN transistor Tra as the collector current of the NPN transistor Tra.

On the other hand, if a negative electrostatic charge of which potential is lower than the ground potential is applied to the terminal Ta, the potential of the cathode becomes lower than the ground potential, so that the negative electrostatic charge flows through the diode Da in the forward direction and its energy is consumed.

As mentioned above, the protection circuit provided to the electrical load driving circuit 90 can suppress the current developed by the high voltage noise on the side of the electrical load 4 to protect the MOS transistor Tr0 from high voltage noises.

However, in the above-mentioned protection circuit, there is the possibility that the protection circuit cannot absorb all current due to the high voltage noise, so that the remaining current may destroy the MOS transistor Tr0. This is because, current capacities of the NPN transistor Tra and the diode Da are insufficient or there is an inductance component on the line to the protection circuit.

More specifically, if a high voltage noise is applied to the terminal Ta and if all current due to the high voltage noise cannot be absorbed by the NPN transistor Tra, a parasitic diode D0 (shown by chain lines in FIG. 12) existing between the drain and the source of the MOS transistor Tr0 absorbs the remaining current. That is, the parasitic diode D0 bypasses the remaining current. Accordingly, the electrical load driving circuit 90 shown in FIG. 12 shows relatively high positive noise withstandingness.

On the other hand, if a negative high voltage noise is applied to the terminal Ta and if the diode Da cannot flow all current due to the high voltage noise, the MOS transistor Tr0 can flow the remaining current therethrough from the drain to the source when the MOS transistor Tr0 is turning on. Thus, the voltage developed between the drain and the source is relatively small, so that the MOS transistor Tr0 is not destroyed.

However, if a high negative noise is applied to the terminal Ta while the MOS transistor Tr0 is in the OFF state, the voltage of the source of the MOS transistor Tr0 largely decreases because there is no passage flowing the not-absorbed current in the circuit. In this condition, if a voltage between the drain and the source which is greater than the withstanding voltage of the MOS transistor Tr0 is developed due to the decrease in the voltage of the source, the MOS As mentioned above, in the above-mentioned prior art protection circuit there may be the case that the protection circuit cannot protect the MOS transistor from the high voltage noise. In consideration of this fact, it may be better that current capacities of the elements in the protection circuit are increased. However, in this case, areas for these elements on an integrated circuit will be increased.

SUMMARY OF THE INVENTION

The aim of the present invention is to provide a superior electrical load driving circuit.

According to the present invention;a first aspect of the present invention provides an electrical load driving circuit comprising: a MOS transistor having first and second electrodes and a gate electrode controlling a channel between said first and second electrodes, for turning on and off a circuit including a driving power supply and an electrical load in accordance with a control signal via said gate electrode with a predetermined polarity in a voltage difference between a drain and a source of said MOS transistor with respect to one of positive and negative terminals of said driving power supply; a first clamping circuit for clamping a first voltage difference between said first and second electrodes to a first predetermined voltage when a high voltage is externally developed between said first and second electrodes, a polarity of said high voltage being the same as said predetermined polarity; and a second clamping circuit for clamping said gate electrode of said MOS transistor to a second predetermined voltage with respect to said one of positive and negative terminals of said driving power supply when said high voltage is externally developed.

Preferably, said MOS transistor comprises an N channel MOS transistor, said second electrode is coupled to said positive terminal of said driving power supply, said negative terminal of said driving power supply is connected to the ground, said second electrode is coupled to said electrical load, said second clamping circuit is provided between said gate electrode and the grounds and said second predetermined voltage is lower than the ground potential by a predetermined voltage and higher than a potential of said second electrode when said high Voltage is externally developed.

In this case, said first clamping circuit may comprise a zener diode of which anode is connected to said first electrode, and a cathode of said zener diode is connected to said second electrode. Moreover, this electrical load driving circuit may further comprise a third clamping circuit including: an NPN transistor of which collector connected to said first terminal and a resistor provided between a base of said NPN transistor and said second terminal, an emitter of said NPN transistor being connected to said second terminal, wherein said NPN transistor turns on when said high voltage is externally developed.

In that case, the electrical load driving circuit may further comprise a third clamping circuit including: an NPN transistor of which collector connected to said first terminal and a resistor provided between a base of said NPN transistor and said second terminal, an emitter of said NPN transistor being connected to said second terminal, wherein said NPN transistor turns on when said high voltage is externally developed. Moreover, the electrical load driving circuit may further comprise a fourth clamping circuit provided between said first electrode and said gate electrode for, when said voltage of said gate electrode is lower than a voltage of said first electrode by a second predetermined voltage, holding said voltage of said gate electrode.

In that case, said second clamping circuit may comprise a diode and an NPN transistor connected to said diode in parallel, a cathode of said diode being connected to said gate electrode, an anode of said diode being connected to the ground, an emitter of said NPN transistor being connected to the ground, a collector of said NPN transistor being connected to said gate electrode of said MOS transistor. Moreover, said second clamping circuit may include: an n type layer on said substrate; a first p type diffusion region in said n type layer; a first n type diffusion region in said n type layer; a second p type diffusion region which are separated from each other with said n type layer; and a second n type diffusion region in said first p type diffusion region, wherein said diode is provided by said second p type diffusion region and said n type layer, said collector of said NPN transistor is provided by said first n type diffusion region, said base of said NPN transistor is provided by said first p type diffusion region, said emitter of said NPN transistor is provided by said second n type diffusion region, said anode of said diode is provided by said second p type diffusion region, said cathode of said diode is provided by said n type layer, wherein said cathode of said diode is connected to said collector of said NPN transistor by said n type layer. Moreover, preferably, the electrical load driving circuit may further comprise a semiconductor structure including a p type substrate, a p type surrounding wall on said p type substrate, an n type layer within said p type substrate and said surrounding wall, and a transistor circuit portion in said n type layer providing said NPN transistor, wherein said diode is provided by said p type surrounding wall and said n type layer.

BRIEF DESCRIPTION OF THE DRAWINGS

The object and features of the present invention will become more readily apparent from the following detailed description taken in conjunction with the accompanying drawings in which.

DETAILED DESCRIPTION OF THE INVENTION

FIRST EMBODIMENT

Figure 1:
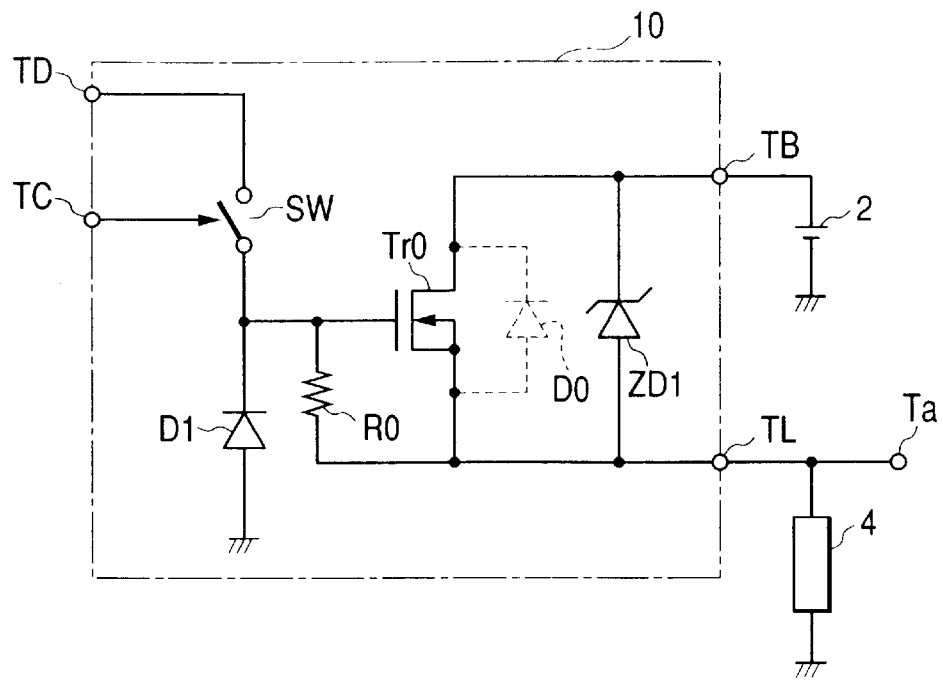
FIG. 1 is a schematic circuit diagram of an electric load driving circuit according to a first embodiment.

FIG. 1 is a schematic circuit diagram of an electric load driving circuit 10 according to a first embodiment. The electrical load driving circuit 10 includes an N channel MOS transistor Tr0 provided on a passage from the positive electrode of a dc power supply 2 to the electrical load 4 as a high side switch, a resistor R0 for reducing the impedance between the gate and the source of the MOS transistor Tr0, a zener diode ZD1 as a first clamp circuit, and a diode D1 as a second clamp circuit. Moreover, a switch SW is provided to supply the MOS transistor drive current as a control signal to the drain of the MOS transistor Tr0. The drain of the MOS transistor Tr0 is connected to a positive terminal of a power supply 2 through a terminal TB of the electrical load driving circuit 10 and the source of the MOS transistor Tr0 is connected to one end of an electrical load 4 through a connection terminal TL of the electrical load driving circuit 10. The gate of the MOS transistor Tr0 is supplied with the MOS transistor driving voltage from a positive power supply through the switch SW via a terminal of the electric load driving circuit 10. The switch SW is controlled in accordance with a switch control signal from a terminal TC of the electric load driving circuit. The resistor R0 reduces the impedance between the gate and the source of the MOS transistor Tr0 to stabilize the turning on and off operation of the MOS transistor Tr0. The cathode of the zener diode ZD1 is connected to the drain of the MOS transistor Tr0 and the anode of the zener diode ZD1 is connected to the source of the MOS transistor Tr0. The cathode of the diode D1 is connected to the gate of the MOS transistor Tr0 and the anode of the diode D1 is connected to the ground. The ground in the electrical load driving circuit is connected to the ground. A negative terminal of the dc power supply 2 and another terminal of the electric load 4.

The gate of the MOS transistor Tr0 controls, as well known, a channel between the drain and the source thereof (first and second electrodes). The MOS transistor Tr0 turns on and off (makes close and open) a circuit including a driving power supply and an electrical load in accordance with a control signal via the gate electrode with a predetermined polarity in a voltage difference between the drain and the source of said MOS transistor Tr0 with respect to one of positive and negative terminals of the dc power supply 2.

In the electrical load driving circuit 10 according to the first embodiment, when a positive high voltage noise (electrostatic charges) is applied to the connection terminal TL through the terminal Ta or the like on the side of the electrical load 4, a forward current flows through the zener diode ZD1 and the parasitic diode D0 of the MOS transistor Tr0. Both act as the first clamp circuit of this embodiment. Thus, only diode forward voltage drop Vf is generated between the drain and the source of the MOS transistor Tr0. This-condition is that the polarity of the voltage drop is opposite to the voltage drop between the drain and the source but the forward voltage drop Vf is very small, so that the MOS transistor Tr0 is not deteriorated or destroyed.

In the case that a negative high voltage noise (electrostatic charge) which is lower than the ground potential is applied to the connection terminal TL through the terminal on the side of the electric load 4, when the MOS transistor Tr0 is turned on, the current due to the negative high voltage flows from the drain to the source of the MOS transistor Tr0. In this condition, though the current flowing through the MOS transistor Tr0 increases from the normal current for driving the electric load 4, the drain-source voltage of the MOS transistor Tr0 will not become excessively large. Thus, the MOS transistor Tr0 is not deteriorated and destroyed.

On the other hand, when a negative high voltage noise (electrostatic charge) is applied to the connection terminal TL and the MOS transistor Tr0 is in the off condition, the source voltage is lower than the ground potential. That is, the drain-source voltage increases with the same polarity as the no-noise condition (the source potential is lower than the drain potential).

However, between the drain and the source of the MOS transistor Tr0, the zener diode ZD1 as the first clamp circuit is provided. Thus, if the drain-source voltage exceeds the breakdown current of the zener diode ZD1, the breakdown current flows through the zener diode ZD1, so that the drain-source voltage is clamped at the breakdown voltage of the zener diode ZD1.

Moreover, if the current capacity of the zener diode ZD1 is relatively low and thus, the negative high voltage noise applied to the connection terminal TL cannot be absorbed by the breakdown current following through the zener diode ZD1, the drain-source voltage exceeds the breakdown voltage of the zener diode ZD1.

However, between the gate of MOS transistor Tr0 and the ground the diode D1 is provided which acts as the second clamp circuit of this embodiment, so that the potential of the source is clamped at a voltage (−Vf) which is lower than the ground potential by the forward voltage drop (Vf) of the diode D1 because the gate of the MOS transistor Tr0 is supplied with a current from the ground through the diode D1.

Thus, when the source potential of the MOS transistor Tr0 becomes lower than the gate potential (−Vf) by the threshold voltage (Vt) of the MOS transistor Tr0, the MOS transistor Tr0 turns on and thus, a current flows through the MOS transistor Tr0. It is assumed that the voltage of the dc power supply 2 is VB. The drain-source voltage VDS of the MOS transistor Tr0 is given by:

$$VDS=VB-Vf-Vt$$

Accordingly, the drain-source voltage is limited under the breakdown voltage of the MOS transistor Tr0.

That is, in the electrical load driving circuit 10 according to this embodiment, when a negative high voltage noise is applied to the connection terminal TL due to electrostatic charges or the like generated on the side of the electrical load 4 while the MOS transistor Tr0 is in the off condition, the zener diode Zd1 that acts as the first clamp circuit flows the breakdown current to absorb the high voltage noise. After this, the diode D1 acting as the second clamp circuit turns on the MOS transistor Tr0, so that the MOS transistor tr0 flows the current which cancels the high voltage noise. Thus, the drain-source voltage of the MOS transistor Tr0 is limited under the breakdown voltage of the MOS transistor Tr0.

According to this embodiment, the MOS transistor Tr0 for driving the electrical load 4 can be surely protected from positive and negative high voltage noises due to electrostatic charges developed on the side of the electrical load 4.

Moreover, it is not necessary that all the current flows through the zener diode ZD1 or the diode D1 to absorb the high voltage noise. Thus, it is sufficient that the current capacities of the zener diode ZD1 and the diode D1 are relatively low. Thus, the areas necessary for providing these elements on an integrated circuit can be reduced. Accordingly, the size of the electrical driving circuit can be reduced.

Figure 2:
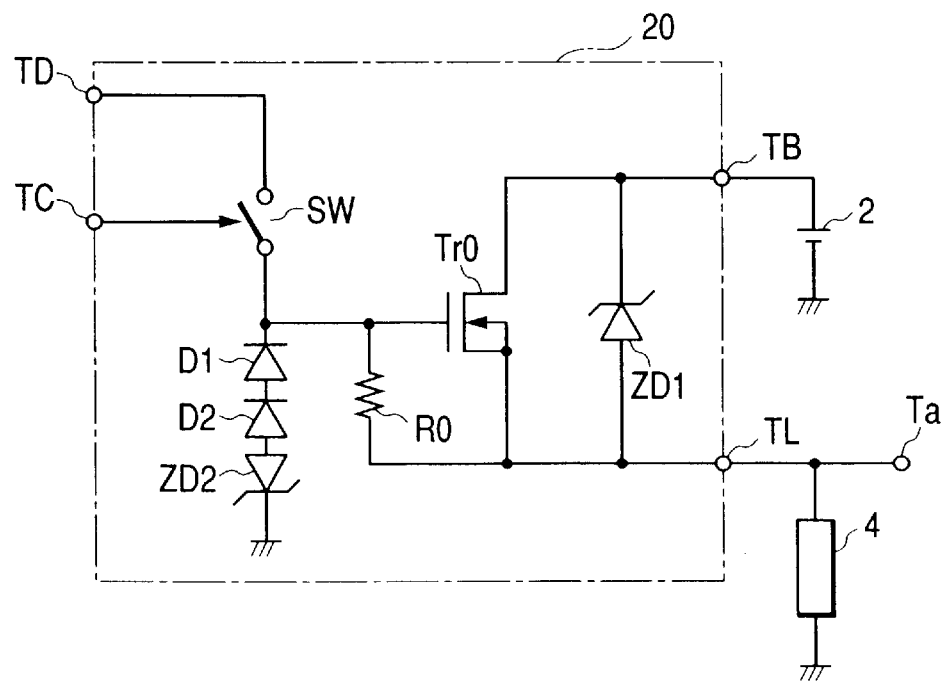
FIG. 2 is a schematic diagram of another circuit example of the electrical load driving circuit of the first embodiment.

FIG. 2 is a schematic diagram of another circuit example of the electrical load driving circuit of the first embodiment.

In the electrical load driving circuit 20 shown in FIG. 1, the second clamp circuit is provided with one diode D1. However, in this circuit a plurality of diodes connected in series provide the second clamp circuit for example.

More specifically, the cathode of a diode D2 is connected to the anode of the diode D1 of which cathode is connected to the MOS transistor Tr0. The anode of the diode D2 is connected to the anode of a zener diode ZD2 of which cathode is connected to the ground. Accordingly, this second clamp circuit clamps at a predetermined voltage (2·Vf+ VZD2), wherein 2· Vf is provided by the diodes D1 and D2 and the VZD2 is provided by the breakdown voltage of the zener diode ZD2.

Moreover, according to the electrical load driving circuit 20, the clamped voltage at the gate of the MOS transistor Tr0 can be set to the lower potential than that of the electrical load driving circuit 10. Thus, if the electrical load 4 comprises an inductive load such as a solenoid, this electrical load driving circuit 20 can prevent from turning on of the MOS transistor Tr0 again due to a negative voltage developed just after tuning off of the MOS transistor Tr0.

Figure 3:
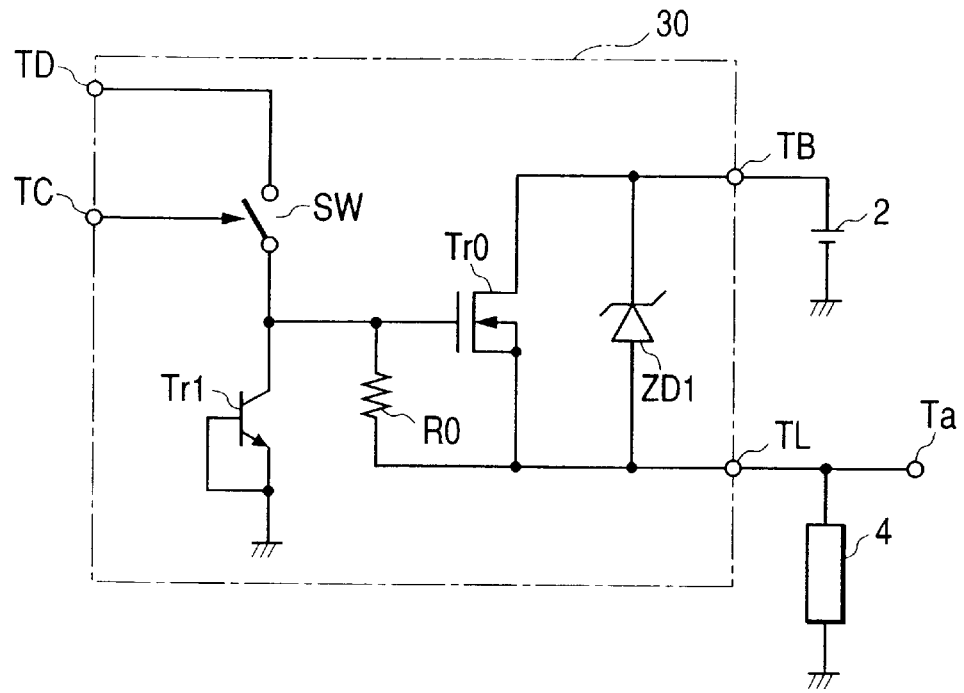
FIG. 3 is a schematic circuit diagram of a modification of the first embodiment.

Moreover, as the diode D1, only PN junction structure is required. That is, there are various other modifications. FIG. 3 is a schematic circuit diagram of such a modification. In FIG. 3, an NPN transistor Tr1 is provided as the second clamp circuit. The emitter and the base of the NPN transistor Tr1 are connected to the ground and the collector the NPN transistor Tr1 is connected to the gate of the MOS transistor Tr0. Accordingly, the collector-base junction clamps the gate potential at the potential that is lower than the ground by a predetermined voltage. Further, in this case, other junctions provided by a PNP transistor, an N channel MOS transistor, or a P channel MOS transistor can be used for this structure.

SECOND EMBODIMENT

Figure 4:
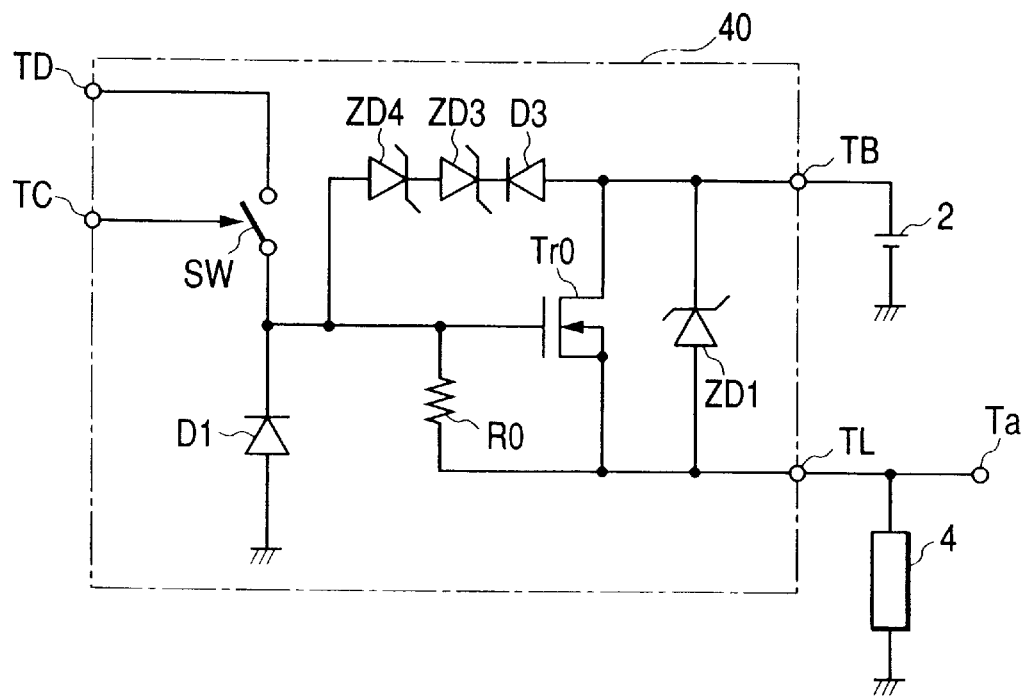
FIG. 4 is a schematic circuit diagram of an electrical load driving circuit according to a second embodiment.

FIG. 4 is a schematic circuit diagram of an electrical load driving circuit 40 according to the second embodiment.

The structure of the electrical load driving circuit 40 according to the second embodiment is substantially as same as that of the first embodiment. The difference is that a diode circuit is further provided between the drain and the gate of the MOS transistor Tr0. The diode circuit includes a diode D3, a zener diode ZD3 and a zener diode ZD4 connected in series. The anode of the diode D3 is connected to the drain of the MOS transistor Tr0, and the cathode of the diode D3 is connected to the cathode of the zener diode ZD3, the anode of the zener diode ZD3 is connected to the cathode of the zener diode ZD4, and the anode of the zener diode ZD4 is connected to the gate of the MOS transistor Tr0.

In this electrical load driving circuit 40, when the potential of the gate is lower than the potential of the drain determined by the positive terminal of the dc power supply 2 by a predetermined voltage (VZD3+VZD4+Vf) determined by the breakdown voltage VZD3 and the breakdown voltage VZD4 of the zener diode ZD4, and the forward voltage drop Vf in the diode D3, the potential of the gate is clamped to (held at) the potential (VB−VZD3−VZD4−Vf) of the gate at that instance.

According to this embodiment, if ground lines in the electric load driving circuit 40 are thin and thus, the ground line potentials are unstable compared with the external ground of the dc power supply 2 and the electric load 4, the ground potentials in the electric load driving circuit 40 may vary with development of the negative high voltage noise. In this case, the diode D1 as the second clamping circuit may incorrectly operate. However, the diode circuit as the fourth clamping circuit can turn on the MOS transistor Tr0 when the negative high voltage noise is developed.

Thus, the electric load driving circuit 40 can more surely protect the MOS transistor Tr0 than the case of the electric load driving circuits 10, 20, 30 shown in FIGS. 1 to 3, so that the reliability of the electric load driving circuit 40 can be improved.

Moreover, the diode D3, the zener diodes ZD3 and ZD4 are not for flowing the current for absorbing the high voltage noise but only for clamping the gate potential of the MOS transistor Tr0, so that it is possible to make the current capacities of the diodes in the diode circuit low. Thus, the diode circuit does not result in increase in the size of the circuit configuration of the electric load driving circuit 40.

Moreover, because the fourth clamping circuit is required only to clamp the gate potential to the potential that is lower than the drain potential by a predetermined voltage when the gate potential of the MOS transistor Tr0 decreases. Thus, the structure shown in FIG. 4 is not always necessary. That is, the number of the diodes or the zener diodes can be varied. Further, other elements for clamping voltages can be used for the diode circuit.

THIRD EMBODIMENT

Figure 5:
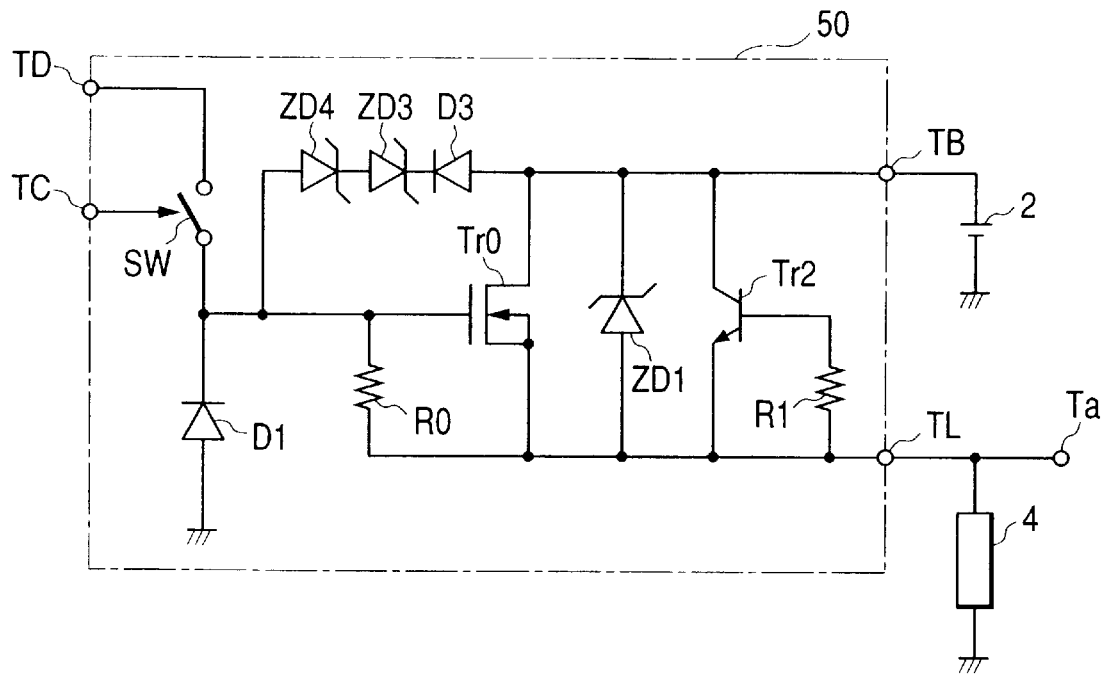
FIG. 5 is a schematic circuit diagram of an electrical load driving circuit according to a third embodiment.

FIG. 5 is a schematic circuit diagram of an electrical load driving circuit 50 according to the third embodiment.

The structure of the electrical load driving circuit 50 according to the third embodiment is substantially as same as that of the second embodiment. The difference is that a third clamping circuit including an NPN transistor and a resistor R1 is further provided.

More specifically, a collector of the NPN transistor Tr2 is connected to the cathode of the zener diode ZD1, i.e., the drain of the MOS transistor Tr0, and the emitter is connected to the anode of the zener diode ZD1, i.e., the source of the MOS transistor TR0. The resistor R1 is provided between the base and the emitter of the NPN transistor Tr2.

In this electrical load driving circuit 50, when negative high voltage noise is developed at the connection terminal TL from the side of the electrical load 4, a current flows through the resistor R1 by collector-base junction of the NPN transistor Tr2, so that the NPN transistor Tr2 turns on. Thus, the NPN transistor TR2 forms a current path bypassing the drain-source.

Thus, in the electrical load driving circuit 50 according to the third embodiment, from when the negative high voltage noise is developed from the side of the electrical load 4 to when the MOS transistor Tr0 turns on by the operation of the second clamping circuit, it is prevented that the voltage difference between the drain and source of the MOS transistor Tr0 increases by currents flowing through the zener diode ZD1 and the NPN transistor Tr2. Thus, the MOS transistor Tr0 is surely protected from the high voltage noise.

Moreover, because the NPN transistor Tr2 is only required to let the current for absorbing the high voltage noise flow from when the high voltage is developed to when the MOS transistor Tr0 turns on, the current capacity of the NPN transistor Tr2 can be low. Thus, providing the NPN transistor Tr2 as the third clamping circuit does not result in increase in the size of the electrical load driving circuit 50.

FOURTH EMBODIMENT

Figure 6:
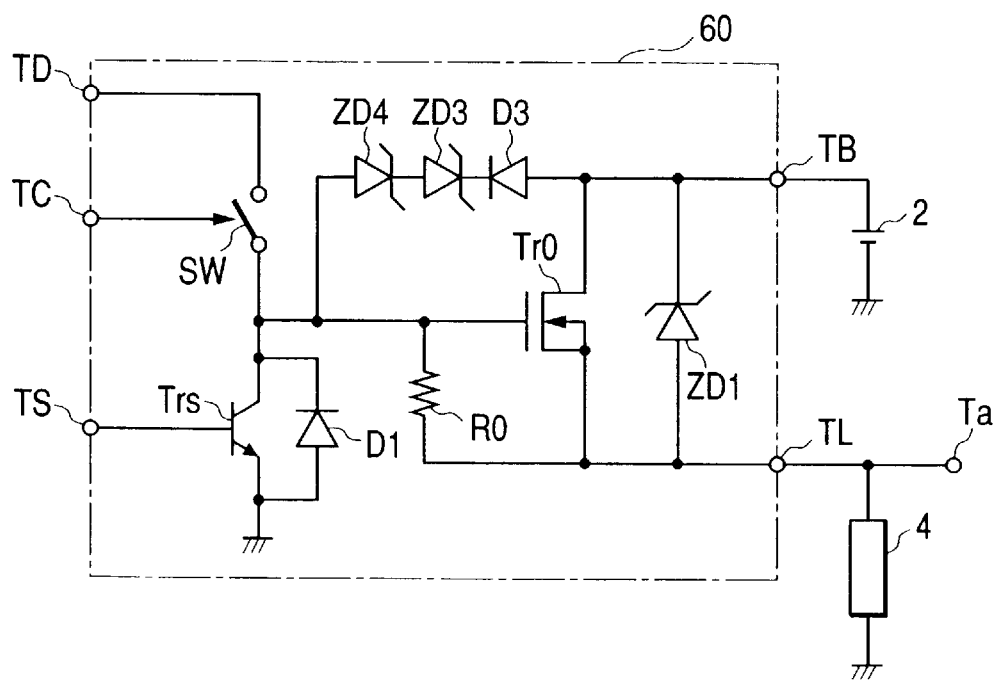
FIG. 6 is a schematic circuit diagram of an electric load driving circuit according to a fourth embodiment.

FIG. 6 shows a schematic circuit diagram of an electric load driving circuit 60 according to a fourth embodiment.

The structure of the electrical load driving circuit 60 according to the fourth embodiment is substantially the same as that of the second embodiment. The difference is that an NPN transistor Trs is further provided as a portion of the second clamping circuit.

More specifically, a collector of the NPN transistor Trs is connected to the gate of the MOS transistor Tr0, i.e., the cathode of the diode D1, the emitter is connected to the ground, and the base is connected to a signal input terminal TS.

In this electrical load driving circuit 60, the MOS transistor Tr0 turns off when the switch SW is turned off because the gate bias voltage is cut off. In addition, the gate of the MOS transistor Tr0 is grounded through the NPN transistor Trs if a high level signal is supplied to the NPN transistor Trs through the input terminal Ts to turn on the NPN transistor Trs. Then, the charge stored in the parasitic capacity of the MOS transistor Tr0 can be rapidly discharged.

Therefore, in the electrical load driving circuit 60, in the operation that supplying the power to the electrical load 4 is stopped by turning off the MOS transistor Tr0, the MOS transistor Tr0 can be rapidly turned off. Thus, this operation provides immediately stopping supplying of the power to the electrical load 4.

Figure 7:
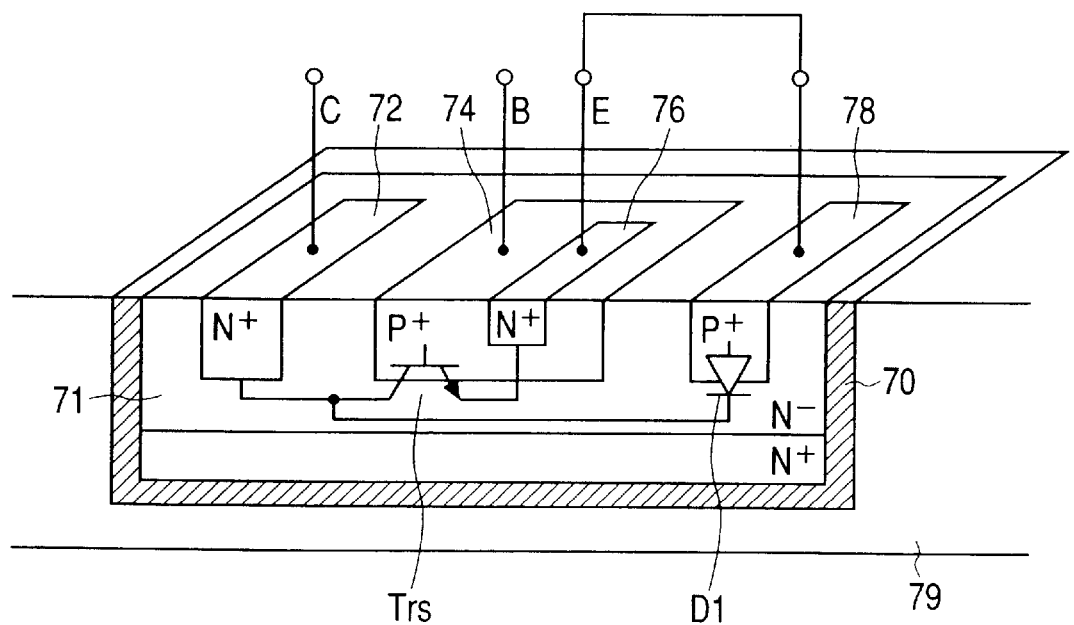
FIG. 7 is a perspective view of an example circuit structure of the NPN transistor and the diode according to the fourth embodiment.

FIG. 7 is a perspective view of the circuit structure of the NPN transistor Trs and the diode D1 according to the fourth embodiment.

The NPN transistor Trs and the diode D1 connected in parallel can be provided unitedly in the semiconductor integrated circuit structure. Moreover, the diode D1 is provided as a parasitic diode of the NPN transistor Trs.

In FIG. 7, the NPN transistor Trs is provided as follows:

An $N^+$ diffusion rejoin 72 and a $P^+$ are formed in N type layer including $N^+$ and $N^-$ types regions surrounded by an insulating film 70 having an open box shape on a substrate 79 for insulating the circuit structure of the NPN transistor Trs and the diode D1 from other elements of the electrical load driving circuit 60 formed on the semiconductor integrated circuit. That is the circuit structure of the NPN transistor Trs and the diode D1 are formed in the insulation separating method using the insulating film 70. Further, $N^+$ diffusion region 76 is formed in the $P^+$ diffusion region 74.

Moreover, a $P^+$ diffusion region 78 is formed in the N type layer 71.

Then, a parasitic diode is provided between the emitter and the collector of the NPN transistor Trs at the $P^+$ diffusion region 78 and the N type layer 71 as the diode D1. More specifically, the cathode of the parasitic diode, i.e., the N type layer 71, is connected to the collector (the $N^+$ diffusion rejoin 72).

As mentioned, the NPN transistor Trs and the diode D1 are formed within the same semiconductor circuit region, so that the circuit area on the semiconductor integrated circuit can be reduced.

Moreover, in this circuit structure of a parasitic PNP transistor formed with this parasitic PNP transistor discharges the charge stored in the base region of the NPN transistor Trs toward the $P^+$ diffusion region 78. Thus, the switching the NPN transistor Trs from on to off conditions is accelerated.

Figure 8:
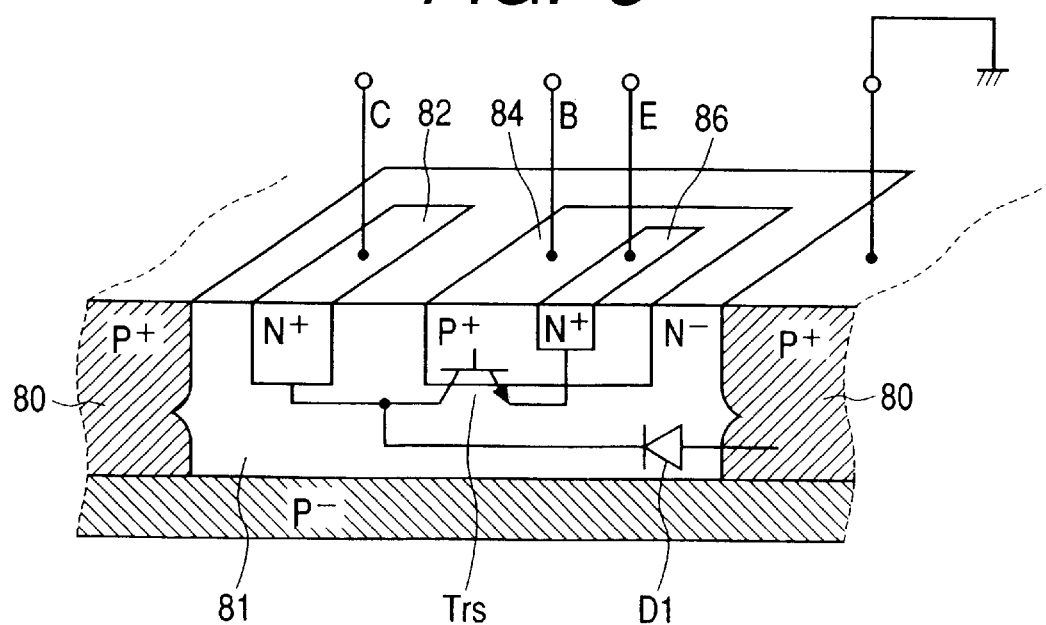
FIG. 8 is a perspective view of another circuit structure of the NPN transistor and the diode according to the fourth embodiment.

FIG. 8 is a perspective view of the circuit structure of the NPN transistor Trs and the diode D1 of another example according to the fourth embodiment.

The circuit structure of the NPN transistor Trs and the diode D1 is formed in the junction separating method. That is, a $P^+$ region 80 having an open box shape separates the circuit structure of the NPN transistor Trs and the diode D1 from other elements of the electrical load driving circuit 60. Moreover, in an $N^+$ layer 81 in the $P^+$ region 80 an $N^+$ diffusion region 82 and a $P^+$ diffusion region 84 are formed. Moreover, in the $P^+$ diffusion region 84, an $N^+$ diffusion region 86 is formed.

The $N^+$ diffusion region 82, the $P^+$ diffusion region 84, and the $N^+$ diffusion region 86 correspond to the collector region, the base region, and the emitter region of the NPN transistor Trs, respectively, and are bonded with leads. Moreover, the $P^+$ region 80 is generally connected to the ground that is the lowest potential of the circuit.

As mentioned above, forming the NPN transistor TRs in the junction separation method provides the parasitic diode between the ground and the collector of the MPN transistor Trs. This parasitic diode can be used as the diode D1 as the second clamping circuit. In this case, it is unnecessary to specially form the $P^+$ diffusion region 78 in FIG. 7, so that the circuit area for the second clamping circuit can be reduced.

As mentioned above, in the first to fourth embodiments, the electrical load driving circuits including the N channel MOS transistors TR0 as high side switches are described. However, this invention is not limited to these embodiments and there are various modifications.

Figure 12:
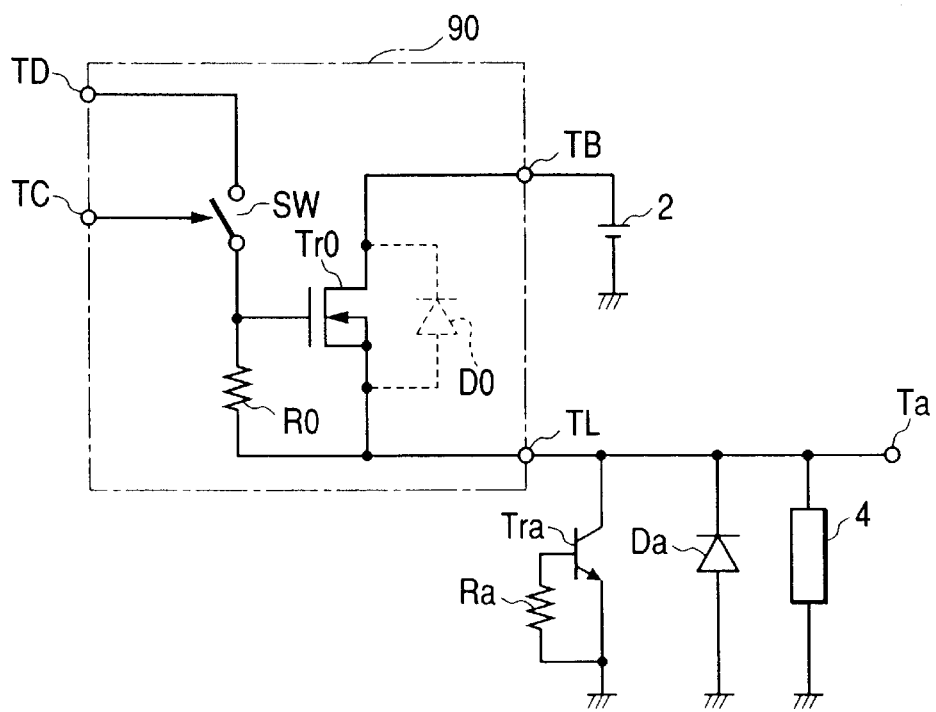
FIG. 12 is a schematic circuit diagram of a prior art electrical load driving circuit including such a protection circuit The same or corresponding elements or parts are designated with like references throughout the drawings.

For example, in the case that N channel MOS transistor Tr0 is used as a high side switch, the protection circuit shown in FIG. 12 may be further provided. That is, the diode Da, the NPN transistor Tra, and the resistor are connected between the connection terminal TL and the ground. This structure provides surer protection for the MOS transistor Tr0.

Figure 9:
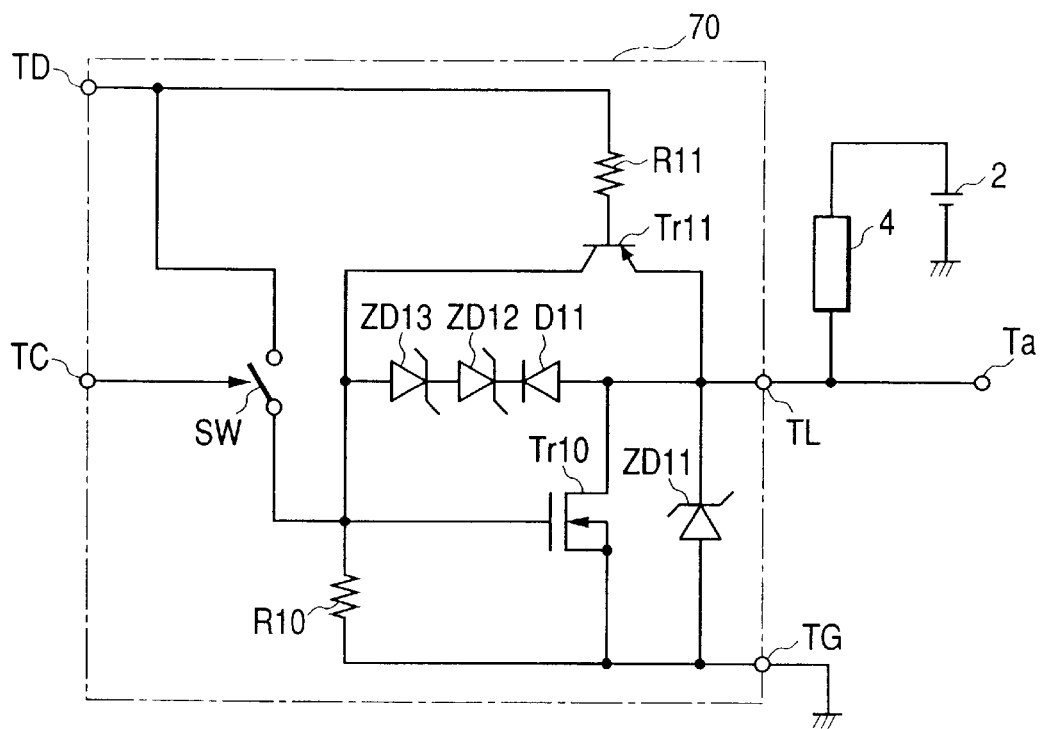
FIG. 9 is a schematic circuit diagram of an electrical load driving circuit of a modification of this invention.
Figure 10:
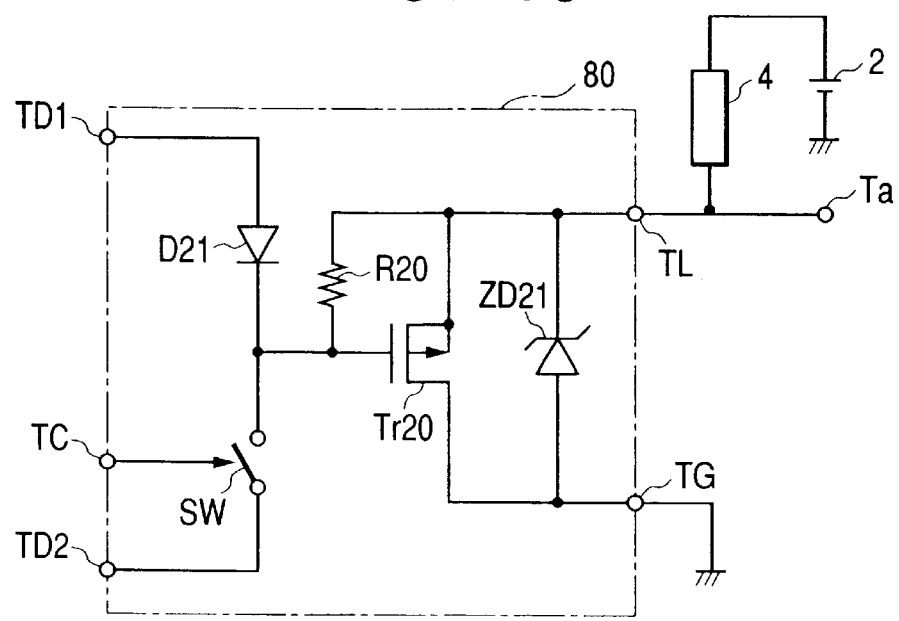
FIG. 10 is a schematic circuit diagram of another example of the low side switch type of electrical load driving circuit using a P channel MOS transistor as a low side switch.

FIG. 9 is a schematic circuit diagram of an electrical load driving circuit 70 of a modification. The electrical lad driving circuit shown in FIG. 9 includes the MOS transistor connected between the electrical load 4 and the ground as a low side switch. In such a structure, if the MOS transistor is of the N channel type, the low side switch type of the electrical load driving circuit 70 is provided as shown in FIG. 9. If the MOS transistor is of the P channel type, the electrical load driving circuit 80 is provided as shown in FIG. 10.

In the electrical load driving circuit shown in FIG. 9, the drain of the MOS transistor Tr 10 is connected to one terminal of the electrical load 4 which is opposite to the dc power supply 2. The source of the MOS transistor Tr10 is connected to the ground through the ground terminal TG of which potential is the same as that of the negative pole of the dc power supply 2. Moreover, a resistor R10 is connected between the gate and the source of the MOS transistor Tr10. Moreover, the gate of the MOS transistor Tr 10 is supplied with a positive voltage from a power supply terminal TD through the switch SW (a switching element such as a transistor).

The switch SW is made close and open (turn on and off) in response to a switching control signal inputted from a control terminal TC. When the positive voltage is supplied to the gate of the MOS transistor Tr10 through the switch SW, the MOS transistor Tr10 turns on and drives the electrical load 4.

In the electrical load driving circuit 70, a zener diode ZD11 as the first clamping circuit is connected to the MOS transistor Tr10. More specifically, an anode of the zener diode ZD11 is connected to the source of the MOS transistor Tr10 and the cathode of the zener diode ZD11 is connected to the drain of the MOS transistor Tr10.

Moreover a PNP transistor Tr11 is provided in the electrical load driving circuit 70. The emitter of the PNP transistor Tr11 is connected to the drain of the MOS transistor Tr10 and the collector of the PNP transistor Tr11 is connected to the gate of the MOS transistor Tr10. Further, a diode circuit including a diode D11, zener diodes ZD12 and ZD13 is connected between the drain and the gate of the MOS transistor Tr10.

The PNP transistor Tr11 acts as the second clamping circuit according this invention and its base is connected to the power supply terminal TD through a resistor R11.

In the diode circuit, the cathode of a diode D11 is connected to the cathode of the zener diode ZD12, the anode of the zener diode ZD12 is connected to the cathode of the zener diode ZD13. The anode of the diode D11 is connected to the drain of the MOS transistor Tr10 and the anode of the zener diode ZD13 is connected to the gate of the MOS transistor Tr10.

In this electrical load driving circuit 70, when a negative high voltage noise of which potential is lower than the ground is induced at the connection terminal TL through the terminal Ta or the like on the side of the electrical load 4, forward currents flow through the zener diode ZD11 and the parasitic diode (not shown) of the MOS transistor Tr10 as the first clamping circuit. Thus, between the drain and source of the MOS transistor rTr10, only a voltage drop due to the forward currents is developed. Accordingly, the MOS transistor Tr10 is not deteriorated or destroyed due to the negative high voltage noise.

If a positive high voltage noise is developed at the connection terminal TL through the terminal Ta or the like on the side of the electrical load 4, and when the MOS transistor tr10 is in the on condition, the current due to the positive high voltage noise flows through the MOS transistor Tr10 from the drain to the source thereof, so that the voltage difference between the drain an the source of the MOS transistor Tr10 does not become excessively large. Thus, the MOS transistor Tr10 is not deteriorated and destroyed.

On tile other hand, if the MOS transistor Tr10 is in the off condition when the positive high voltage is developed at the connection terminal TL, the drain potential of the MOS transistor Tr10 increases, so that the voltage difference between the drain and source voltage increases with the polarity which is the same as that in the on and off conditions when there is no high voltage noise with respect to the positive (or negative) electrode of the dc power supply 2. In other words, the source potential is lower than the drain potential of the MOS transistor TR10.

In this condition, the zener diode ZD11 clamps the voltage difference between the drain and the source of the MOS transistor Tr10 to the breakdown voltage of the zener diode ZD11.

If the current capacity of the zener diode ZD11 is low, and thus, all positive high voltage noise cannot be absorbed by the breakdown current flowing through the zener diode ZD11, the voltage difference between the drain and the source of the MOS transistor Tr10 increases more than the breakdown voltage of the zener diode ZD11. However, between the gate and the drain of the MOS transistor Tr10, the PNP transistor Tr11 as the second clamping circuit is connected, so that when the drain potential exceeds the bias voltage to the drain, the PNP transistor Tr11 turns on. Then, the gate potential of the MOS transistor Tr10 also increases. As the result, the MOS transistor Tr10 turns on and thus, the voltage difference between the drain and the source of the MOS transistor Tr10 is limited under the rate.

Accordingly, this invention is applicable to the electrical load driving circuit 70 using the N channels MOS transistor Tr10 as the low side switch. Thus, the MOS transistor Tr10 can be protected from the positive and negative high voltage noise developed on the side of the electrical load 4.

Moreover, the zener diode ZD11 and the PNP transistor Tr11 as the first and second clamping circuits are not required to let large currents flow, so that it is sufficient that the current capacities of elements actually used as the zener diode ZD11 and the PNP transistor Tr11 are not so large. Thus, the circuit area of the electrical load driving circuit can be reduced.

Moreover, as mentioned above, in the electrical load driving circuit 70, the series diode circuit is provided between the gate and drain in addition to the PNP transistor Tr11 as the second clamping circuit. Thus, though the PNP transistor Tr11 does not operate because the supply voltage inputted from the supply terminal TD varies due to affection of the high voltage noise When a positive high voltage noise is induced at the connection terminal TL, the diode circuit clamps the gate potential of the MOS transistor Tr10 to turn on the MOS transistor TR10.

Moreover, in the low side switch type of electrical load driving circuit 70 as shown in FIG. 9, as similar as the electrical load driving circuit 50 of the third embodiment, the voltage clamping circuit comprising a transistor or the like may be provided in addition to the zener diode ZD11.

FIG. 10 is a schematic circuit diagram of another example of the low side switch type of electrical load driving circuit using a P channel MOS transistor as a low side switch.

The electrical load driving circuit 80 includes a P type MOS transistor Tr20 a resistor R20, a diode D21 a zener diode ZD21, and a switch SW. The source of the P type MOS transistor Tr20 is connected to one terminal of the electrical load 4 through connection terminal TL. The other end of the electrical load 4 is connected to a positive terminal of the dc power supply 20. The drain of the P type of the MOS transistor Tr20 is connected to the ground of which potential is the same as the negative terminal of the dc power supply 2. The resistor R20 is connected between the source and the gate of the P type of the MOS transistor Tr20.

The P type of MOS transistor Tr20 turns on when the gate potential is lower than the drain potential by more than the threshold voltage to supply the power from the dc poser supply 2 to the electrical load 4. Thus, the gate of the P type of MOS transistor Tr20 is supplied with a MOS transistor driving voltage which is lower than the supply voltage of the dc power supply 2 through the switch SW (switching element such as a transistor). The switch SW is made close and open in accordance with a switching control signal inputted from the external through a control terminal TC.

The diode D21 as the second clamping circuit is connected to the gate of the MOS transistor TR20. That is, the gate of the P type of MOS transistor Tr20 is connected to a cathode of the diode D21 and the anode of the diode D21 is connected to the supply power input terminal TD. The zener diode ZD21 as the first clamping circuit is connected between the source and the drain of the MOS transistor Tr20. That is, the cathode of the zener diode ZD21 is connected to the source of the MOS transistor Tr20 and the anode of the zener diode ZD21 is connected to the drain of the MOS transistor Rr20.

In this electrical load driving circuit 80, when a negative high voltage noise of which potential is lower than the ground potential is induced at the connection terminal TL, forward currents flow through the zener diode ZD21 and the parasitic diode (not shown) of the MOS transistor Tr20 as the first clamping circuit, Thus, between the drain and the source of the MOS transistor Tr20 only forward voltage drops of diodes are developed, so that the MOS transistor Tr20 is not deteriorated or destroyed due to the negative high voltage noise.

When a positive high voltage noise is developed at the connection terminal TL through the terminal Ta or the like on the side of the electrical load 4 in the condition that the MOS transistor Tr20 turns on, a current is flowing between the source and the drain. Thus, no excessive voltage occurs between the drain and the source of the MOS transistor Tr20, so that the MOS transistor Tr20 is not deteriorated or destroyed.

On the other hand, when a positive high voltage noise is induced at the connection terminal TL in the condition that the MOS transistor Tr20 turns off, the source potential of the MOS transistor Tr20 increases at the same polarity as that in the no-noise condition. That is, the polarity is determined such that the source potential is higher than the drain potential. In other words, the polarity of voltage difference between the source and the drain with respect to (viewed from) the dc power supply 2 is the same as that of the voltage difference between the source and the drain when no noise.

Then, the zener diode ZD21 clamps the voltage difference between the source and the drain at the breakdown voltage of the zener diode ZD21.

If the current capacity of the zener diode ZD21 is relatively low and thus, the positive high voltage noise cannot be absorbed by the breakdown current flowing through the zener diode ZD21, the voltage differences between the source and the drain of the MOS transistor Tr20 increases over the breakdown voltage of the zener diode ZD21. However, the diode D21 as the second clamping circuit is connected to the gate of the MOS transistor Tr20, so that the gate potential does not increase as increase in the source potential. That is, the gate potential is clamped at a voltage (VB−Vf) which is lower than the supply voltage VB of the dc power supply 2 by the forward voltage drop (Vf) of the diode D1.

Thus, if the source potential of the MOS transistor Tr20 becomes lower than the gate potential (VB−Vf) by the threshold voltage (Vt) of the MOS transistor Tr20, the MOS transistor Tr20 turns on and thus, a current flows through the MOS transistor Tr20, so that the voltage difference VDS between the drain and the source of the MOS transistor Tr20 is given by:

$$VDS=VB-Vf+Vt$$

Therefore, the voltage difference of the MOS transistor is limited under the rate.

Accordingly, in the electrical load driving circuit 80 employing the P channel MOS transistor Tr20 as the low side switch, the MOS transistor TR20 can be protected from negative and positive high voltage noises induced by electrostatic charges or the like on the side of the electrical load 4 as similarly as the first embodiment.

Moreover, it is unnecessary to flow all currents for absorbing the high voltage noises through the zener diode ZD21 and the diode D21 providing the first and second clamping circuits, so that it is unnecessary that the current capacities of elements used in these clamping circuits are large. Thus, the circuit area of these elements can be reduced.

Further, in the low side type of electrical load driving circuit 80, the second clamping circuit may be structured with the combination of the diodes and the zener diode as shown by the electrical load driving circuit 20 shown in FIG. 2. Moreover, the second clamping circuit may be provided with the p-n junction in the transistor Tr1 as shown in FIG. 3.

Still further, in the low side type of electrical load driving circuit 80 shown in FIG. 10, the clamping circuit for clamping (holding) the gate potential at the value at that instance when the gate potential becomes higher than the drain potential by a predetermined voltage may be provided as shown in the electrical load driving circuit 40 of the second embodiment. This structure can prevent that the gate potential of the MOS transistor Tr20 becomes higher than the ground potential by a predetermined voltage. Accordingly, though a positive high voltage noise is induced and thus, the supply power inputted from the supply power input terminal TD1 varies due to the positive high voltage noise, the MOS transistor Tr20 can be turned on.

Moreover, in the low side switch type of electrical load driving circuit 80, the voltage clamping circuit including a transistor or the like may be provided between the drain and the source of the MOS transistor Tr20 in addition to the zener diode ZD21 as shown in FIG. 5.

Figure 11:
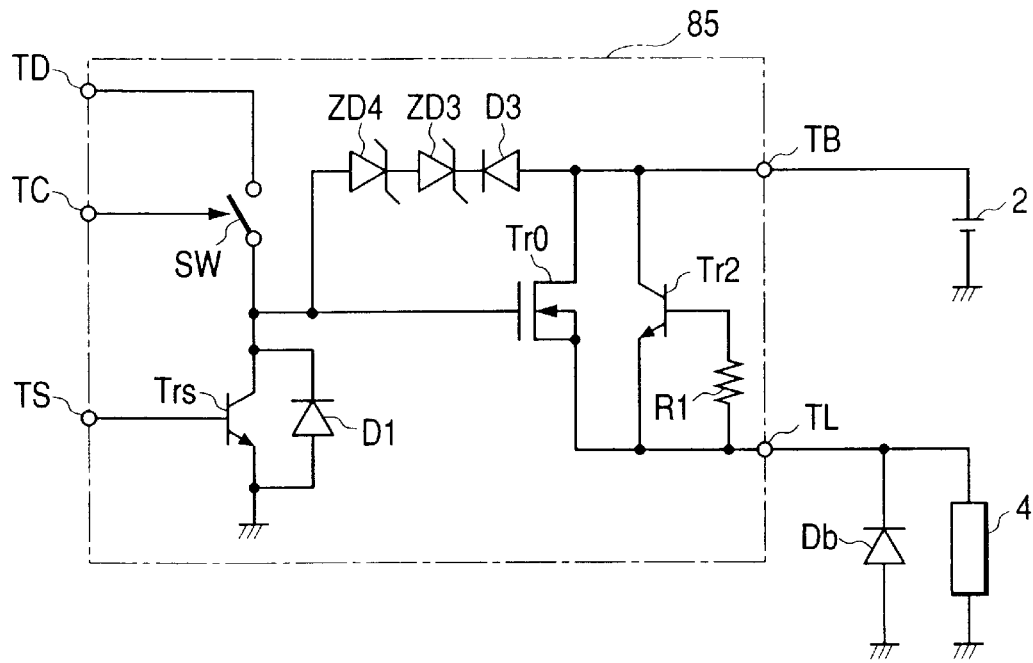
FIG. 11 is a schematic circuit diagram of a modification of the electrical load driving circuit according to the fourth embodiment.

FIG. 11 is a schematic circuit diagram of a modification of the electrical load driving circuit according to the fourth embodiment.

In the above-mentioned embodiments, the zener diode is used as the first clamping circuit. However, as shown in FIG. 11, it is also possible that the third clamping circuit including the NPN transistor TR2 and the resistor R1 as shown in FIG. 5 is used as a single clamping circuit, that is, it is used as the first clamping circuit.

In other words, in the electrical load driving circuit 85 shown in FIG. 11, the clamping circuit including the NPN transistor Tr2 and the resistor R1 replaces the zener diode ZD1 used as the first clamping circuit. In this structure, when a negative high voltage noise is induced on the passage from the MOS transistor Tr0 to the electrical load 4 and thus, a high voltage is developed between the drain and source with the same polarity as that in the no noise condition, a current flows through the resistor R1 by the junction between the collector and base of the NPN transistor Tr2. Thus, the NPN transistor Tr2 turns on and thus, the NPN transistor TR2 provides a current passage bypassing the MOS transistor Tr0, so that the electrical load driving circuit 85 provides the same operation as the electrical load driving circuit 60 of the forth embodiment.

In the electrical load driving circuit 85, the resistor R0 which was provided in the electrical load driving circuit 60 shown in FIG. 60 to stabilize the gate potential of the MOS transistor Tr0 is omitted. This structure prevents that the MOS transistor Tr0 cannot be driven because of the current consumed in the resistor R0 if the output current capacity of a not-shown high voltage generation circuit (generally, a charge pump) used for generating the driving voltage for turning on the MOS transistor TR0 is low.

That is, in the above-mentioned embodiments, the resistors R0, R10, and R20 are used. However, these resistors are not essential and thus, they can be omitted.

Moreover, in FIG. 11, a diode Db of which anode is grounded is provided. This structure is provided for the electrical load which is an inductive one. That is, the diode Db absorbs the counter emf developed when a driving current to an inductance load is stopped. In this structure, when the negative high voltage noise is generated at the passage from the MOS transistor Tr0 to the electrical load 4, a portion of the high voltage noise can be absorbed by the diode Db, so that the current flowing through the first clamping circuit (the NPN transistor Tr2, the zener diode ZD1, etc.) can be reduced.

What is claimed is:

1. An electrical load driving circuit comprising:
    a MOS transistor provided between a driving power supply and an electrical load and having first and second electrodes and a gate electrode controlling a channel between said first and second electrodes, for turning on and off a circuit including said driving power supply and said electrical load in accordance with a control signal via said gate electrode with a predetermined polarity in a voltage difference between said first and second electrodes of said MOS transistor with respect to one of positive and negative terminals of said driving power supply;
    a first clamping circuit for clamping a first voltage difference between said first and second electrodes to a first predetermined voltage when a high voltage is externally applied to a connection point between said MOS transistor and said electrical load, said high voltage generating a voltage difference between said first and second electrodes and having a polarity the same as said predetermined polarity; and a second clamping circuit for clamping said gate electrode of said MOS transistor to a predetermined potential with respect to said one of positive and negative terminals of said driving power supply to turn on said MOS transistor when said high voltage is externally applied to said connection point while said MOS transistor is turned off in accordance with said control signal.

2. An electrical load driving circuit as claimed in claim 1, wherein said MOS transistor comprises an N channel MOS transistor, said first electrode is coupled to said positive terminal of said driving power supply, said negative terminal of said driving power supply is connected to the ground, said second electrode is coupled to said electrical load, said second clamping circuit is provided between said gate electrode and the ground, and said predetermined potential is lower than the ground potential by a predetermined voltage and higher than a potential of said second electrode when said high voltage is externally applied to said point while said MOS transistor is turned off in accordance with said control signal.

3. An electrical load driving circuit as claimed in claim 2, wherein said first clamping circuit comprises a zener diode of which anode is connected to said first electrode, a cathode of said zener diode is connected to said second electrode.

4. An electrical load driving circuit as claimed in claim 3, further comprising a third clamping circuit including: an NPN transistor having a collector connected to said first electrode and a resistor provided between a base of said NPN transistor and said second electrode, an emitter of said NPN transistor being connected to said second electrode, wherein said NPN transistor turns on when said high voltage is externally applied to said point while said MOS transistor is turned off in accordance with said control signal.

5. An electrical load driving circuit as claimed in claim 2, further comprising a third clamping circuit provided between said first electrode and said gate electrode for, when said voltage of said gate electrode is lower than a voltage of said first electrode by a second predetermined voltage, holding said voltage of said gate electrode.

6. An electrical load driving circuit as claimed in claim 2, wherein said second clamping circuit comprises a diode and an NPN transistor connected to said diode in parallel, a cathode of said diode being connected to said gate electrode, an anode of said diode being connected to the ground, an emitter of said NPN transistor being connected to the ground, a collector of said NPN transistor being connected to said gate electrode of said MOS transistor.

7. An electrical load driving circuit as claimed in claim 6, wherein said second clamping circuit includes:

an n type layer on said substrate;

a first p type diffusion region in said n type layer;

a first n type diffusion region in said n type layer;

a second p type diffusion region, said first p type diffusion region, said first n type diffusion region, and said second p type diffusion region being separated from each other with said n type layer; and a second n type diffusion region in said first p type diffusion region, wherein said diode is provided by said second p type diffusion region and said n type layer, said collector of said NPN transistor is provided by said first n type diffusion region, said base of said NPN transistor is provided by said first p type diffusion region, said emitter of said NPN transistor is provided by said second n type diffusion region, said anode of said diode is provided by said second p type diffusion region, said cathode of said diode is provided by said n type layer, wherein said cathode of said diode is connected to said collector of said NPN transistor by said n type layer.

8. An electrical load driving circuit as claimed in claim 6, further comprising a semiconductor structure including a p type substrate, a p type surrounding wall on said p type substrate, an n type layer within said p type substrate and said surrounding wall, and a transistor circuit portion in said n type layer providing said NPN transistor, wherein said diode is provided by said p type surrounding wall and said n type layer.

9. An electrical load driving circuit as claimed in claim 1, wherein said second clamping circuit comprises a diode connected between said gate electrode and the ground, and a resistor having a first end connected to said gate electrode and a second end connected to said second electrode which is connected to said electrical load.

10. An electrical load driving circuit as claimed in claim 1, finder comprising switching signal supplying means for supplying a switching signal as said control signal.

* * * * *